(12) United States Patent
Ye et al.

(10) Patent No.: US 11,973,510 B2
(45) Date of Patent: Apr. 30, 2024

(54) CAPACITANCE-TO-DIGITAL CONVERSION CIRCUIT, A CAPACITANCE-TO-DIGITAL CONVERSION METHOD AND AN ELECTRONIC CHIP

(71) Applicant: HANG ZHOU NANO CORE CHIP ELECTRONIC TECHNOLOGY CO., LTD, Hangzhou (CN)

(72) Inventors: Le Ye, Hangzhou (CN); Heyi Li, Hangzhou (CN); Ru Huang, Hangzhou (CN); Hao Zhang, Hangzhou (CN); Yuanxin Bao, Hangzhou (CN)

(73) Assignee: HANG ZHOU NANO CORE CHIP ELECTRONIC TECHNOLOGY CO., LTD, Zhejiang (CN)

( * ) Notice: Subject to any disclaimer, the term of this patent is extended or adjusted under 35 U.S.C. 154(b) by 157 days.

(21) Appl. No.: 17/751,900

(22) Filed: May 24, 2022

(65) Prior Publication Data
US 2022/0385296 A1 Dec. 1, 2022

(30) Foreign Application Priority Data
May 25, 2021 (CN) .......................... 202110571568.9

(51) Int. Cl.
*H03M 1/06* (2006.01)
(52) U.S. Cl.
CPC ................................ *H03M 1/0604* (2013.01)
(58) Field of Classification Search
CPC ... H03M 1/0604; H03M 1/0607; H03M 1/001
USPC ................................ 341/118, 120, 144, 155
See application file for complete search history.

(56) References Cited

U.S. PATENT DOCUMENTS

| | | | | |
|---|---|---|---|---|
| 5,633,863 A | * | 5/1997 | Gysel | H04B 3/23 370/290 |
| 8,723,706 B1 | * | 5/2014 | Shin | H03M 1/1019 341/161 |
| 2015/0358029 A1 | * | 12/2015 | Wang | H03M 3/37 341/143 |
| 2021/0242878 A1 | * | 8/2021 | Modaffari | H03M 3/464 |

\* cited by examiner

*Primary Examiner* — Peguy Jean Pierre

(57) ABSTRACT

Disclosed are a capacitance-to-digital conversion circuit, a capacitance-to-digital conversion method and an electronic chip. The capacitance-to-digital conversion circuit includes a first module, a comparator and an adaptive range-shift module; the first module includes a successive approximation unit, a first adder, a first digital-to-analog converter, a second adder, a third adder and an integrating unit. The first module further includes a second digital-to-analog converter connected to the third adder. The comparator, the adaptive range-shift module and the first adder are connected in series and the comparator is connected to the second digital-to-analog converter. By the present application, the adverse influence caused by the parasitic and interference is well avoided, the capacitance-to-digital conversion circuit may work in a harsh environment, the robustness of the circuit is significantly improved and the application range of the circuit is expanded.

10 Claims, 6 Drawing Sheets

CAPACITANCE-TO-DIGITAL CONVERSION CIRCUIT, A CAPACITANCE-TO-DIGITAL CONVERSION METHOD AND AN ELECTRONIC CHIP

The present disclosure claims the priority of Chinese patent application under CN202110571568.9 filed on May 25, 2021. The contents of the aforementioned application are incorporated herein by reference in its entirety.

TECHNICAL FIELD

The present application relates to the technical field of integrated circuits, and in particular, to a capacitance-to-digital conversion circuit, a capacitance-to-digital conversion method and an electronic chip.

BACKGROUND

With the development of the Internet of Things (IoT) chip technologies, an enormous number of sensor chips need to be deployed at IoT nodes. Cost and power consumption needs to be considered in more extensive deployment. On the one hand, the cost of chips is expected to be low enough during deployment. On the other hand, it is hoped that chips will be "permanently used" after being powered once, and the battery does not need to be replaced during the later maintenance and it is also hoped that the sensor chips can still work normally in a harsh environment. A capacitive sensor chips, as low-cost and energy-efficient sensing interface circuits, have broad application prospects in the sensor end of the Internet of Things. Humidity sensors, pressure sensors, acceleration sensors, displacement sensors, touch sensors, electronic skin, etc. can be designed based on capacitive sensor chips. SAR-based capacitive sensors have low resolution limits its application in the sensing end except high energy efficiency. The DSM-based capacitive sensors have high precision, but the integrator is high in power consumption and loss in energy efficiency. In addition, they have relatively small input dynamic range due to limitation to the output swing of the amplifier. Although zoom capacitive sensors can better balance the precision and dynamic range, it is necessary to leave a redundancy between the stages in order for the previous and subsequent stages to work in harmony. However, too much redundancy will bring about loss of precision, resulting in reduced energy efficiency, and too small redundancy will reduce the robustness of the chips. Therefore, it is urgent to develop a technical solution that can not only ensure energy efficiency and precision without loss, but also ensure high robustness.

SUMMARY

The present application provides a capacitance-to-digital conversion circuit, a capacitance-to-digital conversion method and an electronic chip, which can not only ensure the energy efficiency and precision of the circuit, but also ensure high robustness.

The application provides a capacitance-to-digital conversion circuit, including a first module, a comparator and an adaptive range-shift module, the first module includes a successive approximation unit, a first adder, a first digital-to-analog converter, a second adder, a third adder, and a first integrating unit connected in series, and the first module further includes a second digital-to-analog converter connected to the third adder, the comparator, the adaptive range-shift module and the first adder are connected in series; and the comparator is connected to the second digital-to-analog converter.

The present application further provides a capacitance-to-digital conversion method, performed by the above-mentioned capacitance-to-digital conversion circuit; the method includes:

coarsely quantizing, by a successive approximation unit, a capacitor sensing signal to be measured through a successive approximation register to obtain a coarse quantization result, calculating, by a first adder, a sum of the coarse quantization result and a compensation value, the compensation value is derived from an adaptive range-shift module, converting, by a first digital-to-analog converter, the sum to a first analog signal, calculating, by a second adder, a first difference between the capacitor sensing signal to be measured and the first analog signal, calculating, by a third adder, a second difference between the first difference and a second analog signal from a second digital-to-analog converter, integrating, by a first integrating unit, the second difference from the third adder to obtain a first integral value, performing, by a comparator, differential operation on the first integral value and a reference value to obtain an operation result, and converting the operation result into a bitstream, determining, by an adaptive range-shift module, whether the coarse quantization result needs to be compensated based on the bitstream, calculating a compensation value when the coarse quantization result needs to be compensated, and inputting the compensation value into the first adder, and converting, by the second digital-to-analog converter, the bitstream from the comparator into a second analog signal, and inputting the converted analog signal to the third adder.

The present application further provides an electronic chip, including any one of the capacitance-to-digital conversion circuits described above.

In these embodiments of the present application, a bitstream output by the comparator is processed by the adaptive range-shift module to determine whether the coarse quantization result needs to be compensated, and to calculate the compensation value when the coarse quantization result needs to be compensated, the compensated quantization output works in an input range of the subsequent-stage DSM, and thus an adverse influence of the error in SAR quantization results caused by various parasitics and types of interference, etc. on the DSM fine quantization can be avoided, and thus the adverse influence caused by the parasitic and interference is well avoided, the capacitance-to-digital conversion circuit may work in a harsh environment, the robustness of the circuit is significantly improved and the application range of the circuit is expanded.

BRIEF DESCRIPTION OF THE DRAWINGS

In order to illustrate embodiments of the present application or the technical solutions in the related art more clearly, drawings that need to be used in the embodiments and related art are briefly introduced. The drawings in the following description are some embodiments of the present application and other drawings can also be obtained based on these drawings without any creative efforts for those of ordinary skill in the art.

DETAILED DESCRIPTION

In order to make the objectives, technical and advantages of the present application clearer, the technical solutions in the embodiments of the present application will be clearly and completely described below with reference to the drawings in the embodiments of the present application. The described embodiments are a part but not all of the present application. All other embodiments obtained by those of ordinary skill in the art based on the embodiments of the present application without creative efforts shall fall within the protection scope of the present application.

In order to make the technical solutions of the present application clearer, the embodiments of the present application will be described in detail below with reference to the drawings.

Figure 1:
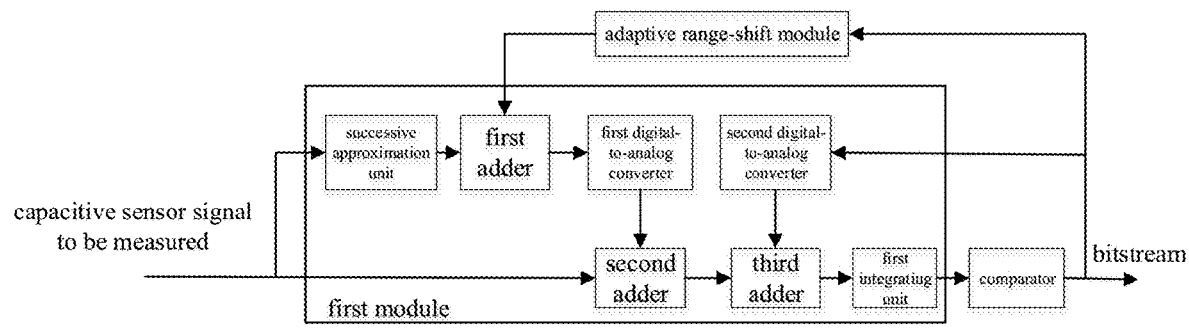
FIG. 1 shows a structural block diagram of a capacitance-to-digital conversion circuit according to an embodiment of the present application.

As shown in FIG. 1, an embodiment of the present application provides a capacitance-to-digital conversion circuit, including a first module, a comparator, and an adaptive range-shift module, the first module includes a successive approximation unit, a first adder, a first digital-to-analog converter, a second adder, a third adder, and a first integrating unit connected in series, and the first module further includes a second digital-to-analog converter connected to the third adder, the comparator, the adaptive range-shift module and the first adder are connected in series; and the comparator is connected to the second digital-to-analog converter.

Figure 2:
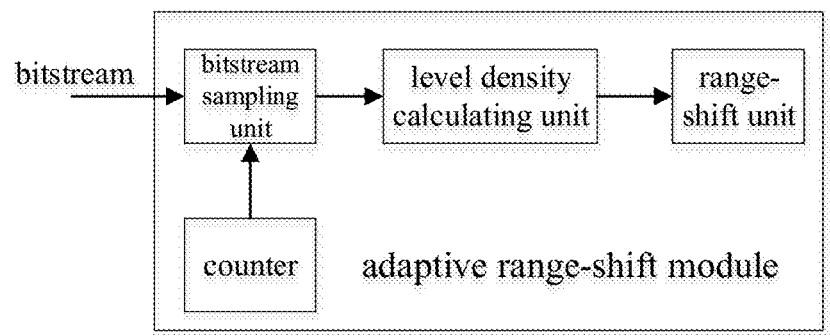
FIG. 2 shows a structural block diagram of an adaptive range-shift module in the embodiment shown in FIG. 1.

As shown in FIG. 2, the adaptive range-shift module includes a bitstream sampling unit, a level density calculating unit and a range-shift unit connected in series The adaptive range-shift module further includes a counter, and the counter is connected with the bitstream sampling unit.

The second digital-to-analog converter may be a reference capacitor.

The successive approximation unit is configured to receive the capacitive sensor signal to be measured, and coarsely quantize the capacitive sensor signal to be measured through the successive approximation register to obtain a coarse quantization result.

The first adder is configured to calculate a sum of the coarse quantization result and a compensation value, and the compensation value is derived from the adaptive range-shift module.

A first digital-to-analog converter is configured to convert the sum from the first adder to a first analog signal.

The second adder is configured to calculate a first difference between the capacitor sensing signal to be measured and the first analog signal from the first digital-to-analog converter.

The third adder is configured to calculate a second difference between the first difference from the second adder and a second analog signal from a second digital-to-analog converter.

The first integrating unit is configured to integrate the second difference from the third adder to obtain a first integral value.

The comparator is configured to perform a differential operation between the first integral value and a reference value to obtain an operation result, convert the operation result into a bitstream, and output the bitstream.

The adaptive range-shift module is configured to determine whether the coarse quantization result needs to be compensated based on the bitstream output from the comparator, calculate a compensation value when the coarse quantization result needs to be compensated, and input the compensation value into the first adder.

The second digital-to-analog converter is configured to convert the bitstream from the comparator into a second analog signal, and input the converted analog signal to the third adder.

The adaptive range-shift module includes a bitstream sampling unit, a level density calculating unit and a range-shift unit connected in series, the bitstream sampling unit is configured to sample the bitstream output by the comparator to obtain a sampling result, the level density calculating unit is configured to perform high level density calculation or low level density calculation on the sampling result to obtain a level density calculation result, and the range-shift unit is configured to determine whether the coarse quantization result needs to be compensated based on the level density calculation result, and calculate a compensation value when the coarse quantization result needs to be compensated, and input the compensation value to the first adder.

The adaptive range-shift module further includes a counter, the counter is connected with the bitstream sampling unit, and is configured to calculate sampling number of times of the bitstream sampling unit.

Figure 3:
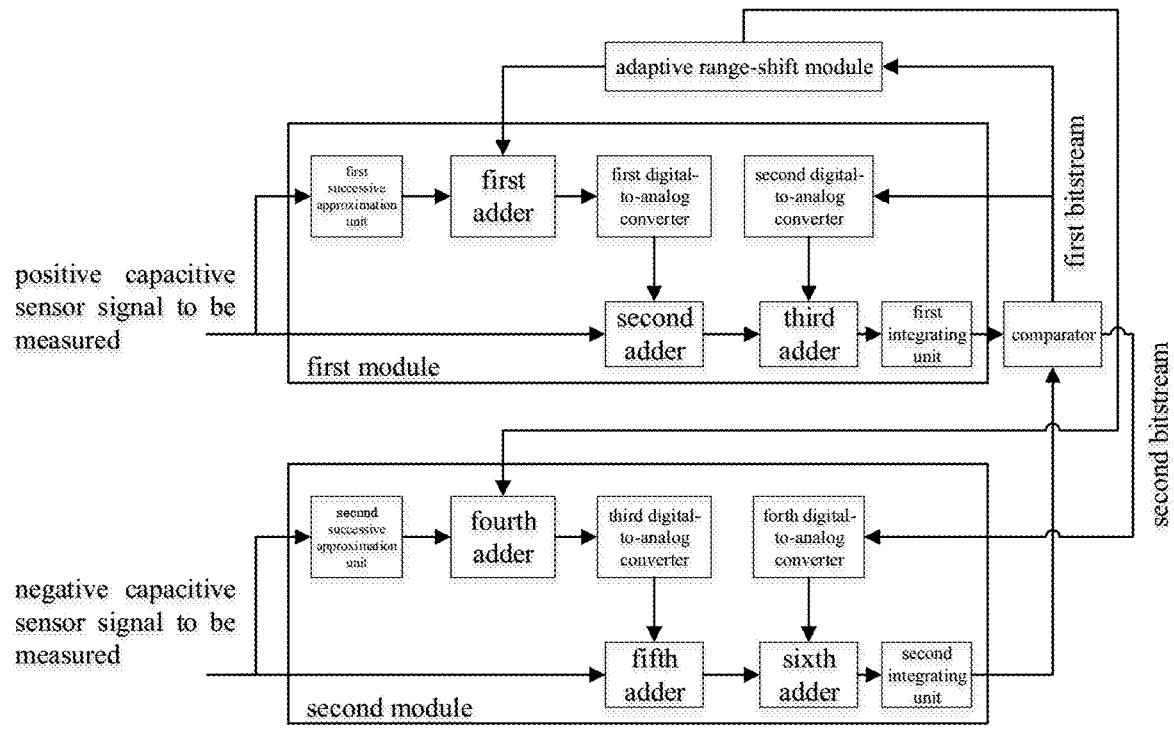
FIG. 3 shows a structural block diagram of a capacitance-to-digital conversion circuit according to another embodiment of the present application.

As shown in FIG. 3, in some embodiments, the capacitance-to-digital conversion circuit further includes a second module having a same structure as the first module; a second integrating unit of the second module, the comparator and a second digital-to-analog converter of the second module are connected in series, and the adaptive range-shift module is connected to a first adder of the second module. The successive approximation unit of the first module is configured to coarsely quantize a positive capacitor sensing signal to be measured and the successive approximation unit of the second module is configured to coarsely quantize a negative capacitor sensing signal to be measured. The reference value is a second integral value of the second integrating unit of the second module. The comparator is configured to perform differential operation on the first integral value from the first module and a second integral value from the second module to obtain an operation result, convert the operation result into a first bitstream and input the first bitstream into the second digital-to-analog converter of the first module, perform inversion operation on the first bitstream to obtain a second bitstream and input the second bitstream into the fourth digital-to-analog converter of the second module. The first module and the second module together constitute a pseudo-differential structure.

Figure 4:
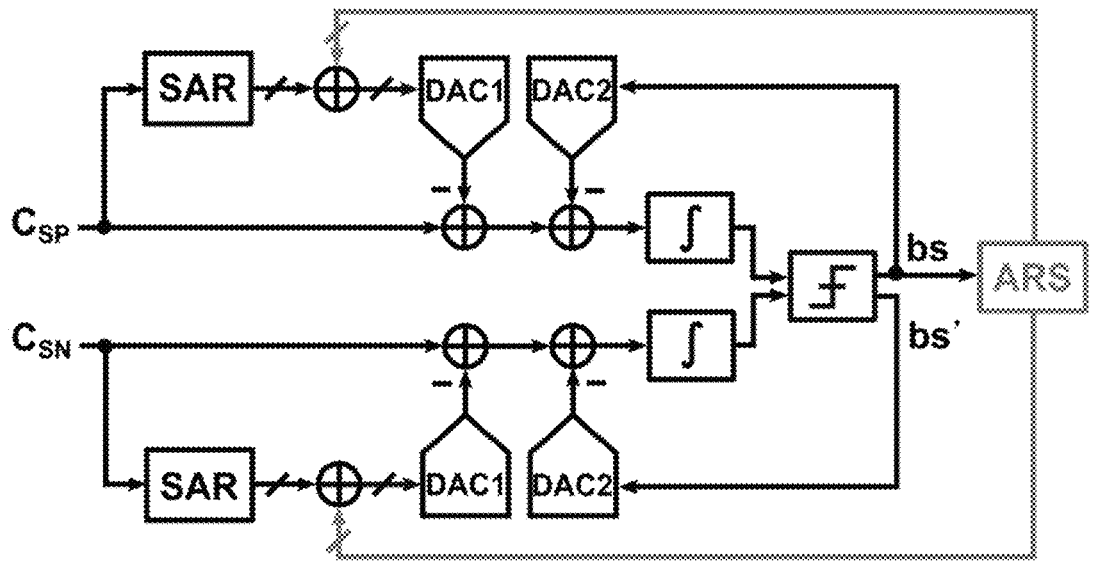
FIG. 4 shows a logical schematic diagram of the capacitance-to-digital conversion circuit shown in FIG. 3.

FIG. 4 shows an example logic diagram of this embodiment, $C_{SP}$ represents the positive capacitive sensor signal to be measured, $C_{SN}$ represents the negative capacitive sensor signal to be measured, bs represents the bitstream, and bs' represents a negative bitstream.

Figure 5:
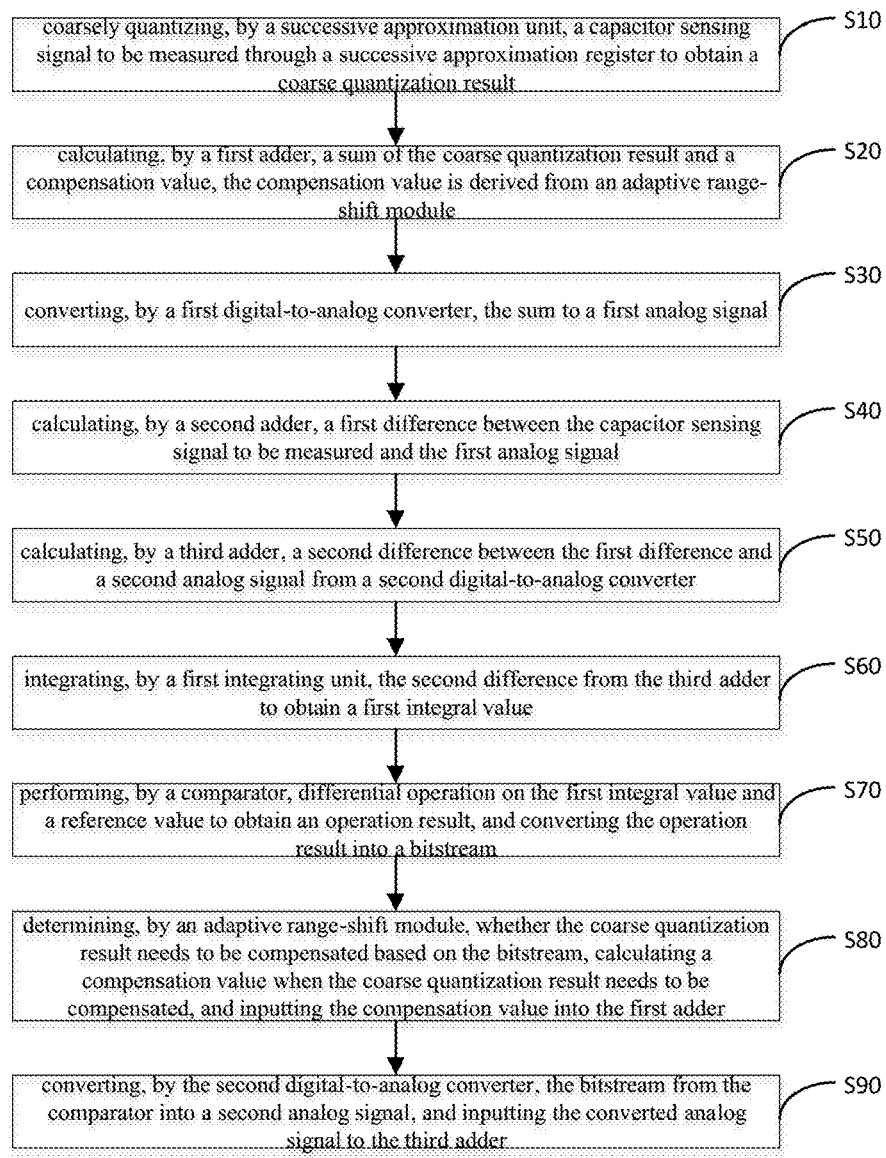
FIG. 5 shows a flowchart of a capacitance-to-digital conversion method according to an embodiment of the present application.

As shown in FIG. 5, another embodiment of the present application provides a capacitance-to-digital conversion method, which is performed by the capacitance-to-digital conversion circuit of any of the above embodiments. The method includes:

S10, coarsely quantizing, by a successive approximation unit, a capacitor sensing signal to be measured through a successive approximation register to obtain a coarse quantization result, S20, calculating, by a first adder, a sum of the coarse quantization result and a compensation value, the compensation value is derived from an adaptive range-shift module, S30, converting, by a first digital-to-analog converter, the sum to a first analog signal, S40, calculating, by a second adder, a first difference between the capacitor sensing signal to be measured and the first analog signal, S50, calculating, by a third adder, a second difference between the first difference and a second analog signal from a second digital-to-analog converter, S60, integrating, by a first integrating unit, the second difference from the third adder to obtain a first integral value, S70, performing, by a comparator, differential operation on the first integral value and a reference value to obtain an operation result, and converting the operation result into a bitstream, S80, determining, by an adaptive range-shift module, whether the coarse quantization result needs to be compensated based on the bitstream, calculating a compensation value when the coarse quantization result needs to be compensated, and inputting the compensation value into the first adder, and S90, converting, by the second digital-to-analog converter, the bitstream from the comparator into a second analog signal, and inputting the converted analog signal to the third adder.

Figure 6:
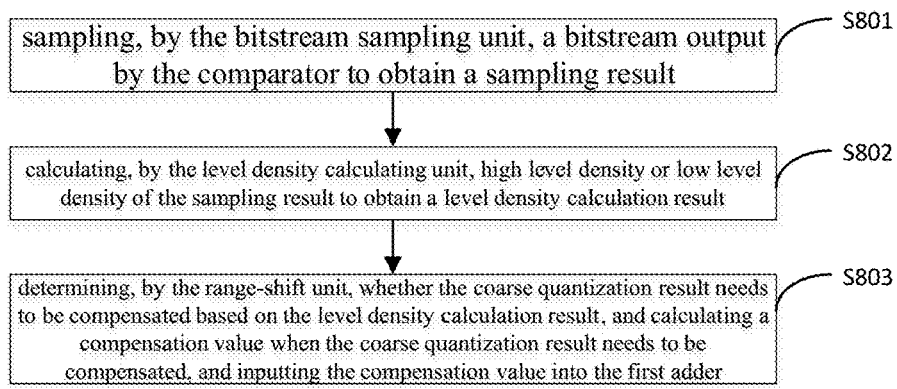
FIG. 6 shows the flowchart of step S80 in FIG. 5.

In some embodiments, the adaptive range-shift module includes a bitstream sampling unit, a level density calculating unit and a range-shift unit connected in series, As shown in FIG. 6, step S80 includes:

S801, sampling, by the bitstream sampling unit, a bitstream output by the comparator to obtain a sampling result, S802, calculating, by the level density calculating unit, high level density or low level density of the sampling result to obtain a level density calculation result, and S803, determining, by the range-shift unit, whether the coarse quantization result needs to be compensated based on the level density calculation result, and calculating a compensation value when the coarse quantization result needs to be compensated, and inputting the compensation value into the first adder.

In some embodiments, the capacitance-to-digital conversion circuit further includes a second module with having a same structure as the first module; a second integrating unit of the second module, the comparator, and a fourth digital-to-analog converter of the second module connected in series; the adaptive range-shift module is connected with the fourth adder of the second module, a capacitor sensing signal to be measured coarsely quantized by a successive approximation unit of the first module is positive, a capacitor sensing signal to be measured coarsely quantized by a successive approximation unit of the second module is negative, and the reference value is a second integral value of the second integrating unit of the second module.

Figure 7:
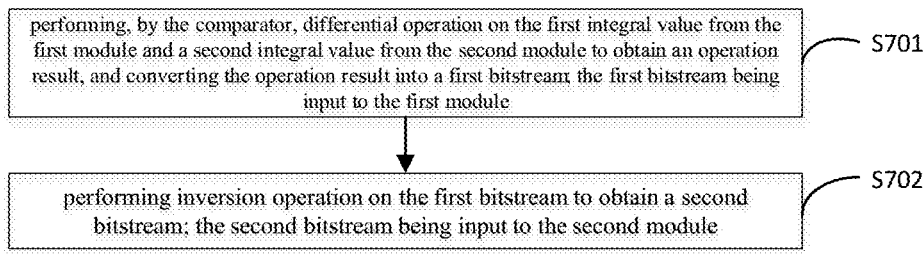
FIG. 7 shows the flowchart of step S70 in FIG. 5.

As shown in FIG. 7, step S70 includes:

S701, performing, by the comparator, differential operation on the first integral value from the first module and a second integral value from the second module to obtain an operation result, and converting the operation result into a first bitstream; the first bitstream being input to the first module, and S702, performing inversion operation on the first bitstream to obtain a second bitstream; the second bitstream being input to the second module.

Another embodiment of the present application provides an electronic chip including the capacitance-to-digital conversion circuit of any one of the above embodiments. For example, the electronic chip may be a memory-computing integrated chip, a communication chip, or a sensor chip, or the like.

Another embodiment of the present application provides a capacitance-to-digital converter (CDC). CDC is designed based on the adaptive range-shift (ARS) technology and has stronger robustness compared with the traditional structure.

A zoom architecture is used in the capacitance-to-digital converter and CDC is divided into two or more stages to quantize an input capacitor. In the present embodiment, a first stage of the CDC adopts a successive approximation register (SAR) for coarsely quantizing the input capacitor signal to be measured, which can effectively expand an input dynamic range. A second stage adopts a delta-sigma modulator (DSM) to finely quantize the coarse quantization results of the first stage and thus a calculation accuracy of the capacitive sensor signal to be measured is improved Usually, some redundancy needs to be reserved between the stages to resist process fluctuations, parasitics and interference in order to connect and match between the previous and subsequent stages of the zoom architecture. In some scenarios with severe parasitics and interference, such as performing off-chip testing on capacitive sensors, there may be extremely large parasitics. In this case, the coarse quantization output of the first stage may exceed the input dynamic range of the second stage which results in that the second stage does not work or works abnormally, and a serious impact on the performance of the entire circuit.

The adaptive range-shift scheme is adopted in the present embodiment in which it can be determined that whether the coarse quantization output result of the SAR still falls within the input dynamic range of the DSM or whether it falls within the optimal input range [a, b] of the DSM by counting the high-level/low-level density of bitstream (abbreviated bs) output from the DSM. Coarse quantization output code of the first-stage SAR will be compensated when the coarse quantization output result of the SAR does not fall within the set working range [a, b], 1 is added or distracted for each compensation and DSM is finely quantized again. The ARS module will continue to be compensated when the coarse quantization output result of the SAR does not still fall within the set working range [a, b] until the DSM works in the predetermined working range [a, b]. By the scheme, the ARS module can always compensate the first-level output code regardless of errors caused by parasitics or interference to ensure that the second-stage DSM can work normally, thereby improving the robustness of the entire circuit. In addition, the first stage can also adopt a simpler and more energy-efficient architecture and circuit scheme due to strong robustness of the entire circuit, which helps to improve the energy efficiency of the system.

Figure 8:
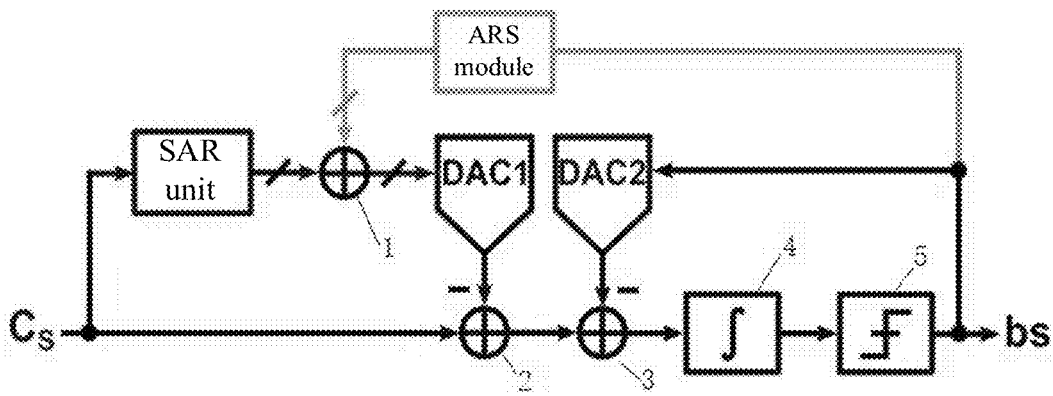
FIG. 8 shows a schematic logic diagram of a capacitance-to-digital conversion circuit according to another embodiment of the present application.

For example, as shown in FIG. 8, the capacitance-to-digital converter includes a SAR unit, an adder 1, an adder 2, an adder 3, a digital-to-analog converter DAC1, a digital-to-analog converter DAC2, an integrator 4, a comparator 5, and an ARS module. An input capacitive sensor signal to be measured is Cs, and the capacitive sensor signal Cs to be measured is coarsely quantized in a first stage. The first stage includes a SAR unit, an adder 1 and a digital-to-analog converter DAC1 connected in series. The second stage of DSM includes an integrator 4, a comparator 5 and a digital-to-analog converter DAC2 connected in series. The coarse quantization result in the first stage is input into the second stage of DSM for further fine quantization, thereby improving the conversion accuracy. The DAC1 in the first stage is connected to the adder 2, the adder 2 is connected to the adder 3, the adder 3 is connected to the integrator 4 of the second stage, the DAC2 is connected to the adder 3, and the ARS module is connected to the comparator 5 and the adder 1, respectively.

The order of the integrator 4 is determined as needed, and can be 1st order, 2nd order, 3rd order, 4th order or even higher order. The comparator 5 may be a single-bit comparator or a multi-bit comparator, and may be a static comparator or a dynamic comparator. The DAC2 can use a digital-to-analog converter with a fixed reference capacitance $C_{ref}$ since the comparator 5 of the second stage of DSM in the present embodiment is a single-bit comparator. The adaptive range-shift (ARS) scheme is implemented by sampling the output digital bitstream (bs) of the comparator 5 in the second stage of the DSM in the present embodiment.

The Zoom architecture in the above-mentioned embodiment may have, but not limited to, only two stages, and may also be a structure with more stages. Usually, redundancy needs to be reserved between different stages to ensure that the previous and subsequent stages can work in coordination and excessive redundancy will cause an unnecessary loss of precision. However, in some scenarios with large parasitics and interference, the error in the coarse quantization result output from the first stage may make the second stage fails to work, or cause very poor working performance. Therefore, a method capable of correcting the output error of the first stage, known as adaptive range-shift scheme (ARS), is proposed. The core of this scheme is to determine whether the second stage of DSM is working abnormally by an indicator, such as the high-level/low-level density of bs. The output of the first stage will be automatically compensated when the second stage of DSM is working abnormally. The direction of compensation is a direction for allowing the DSM work normally and the working state of the second stage of the DSM will gradually return to normal or best working condition after multiple compensations and re-determinations.

In some embodiments, the delta-sigma modulator (DSM) may be first order, second order, third order, fourth order, higher order, etc.

In some embodiments, the DAC2 in the ΔΣ modulator may use a reference capacitor $C_{ref}$, which may be an interdigital capacitor, a plate capacitor, or the like.

In some embodiments, the adaptive range-shift scheme determines whether the working state of the DSM is normal by analyzing the bitstream bs output from the DSM. The output of the first stage is automatically compensated if the DSM works abnormally or does not reach a preset optimal working state to ensure that the quantized output result of the first stage works within the optimal input range of the DSM.

In some embodiments, the adaptive range-shift scheme determines whether to compensate the quantized output result of the previous stage and how much should be compensated by judging the bs output by the DSM. The high level density of the bitstream bs can be judged, and the low level density of the bitstream bs can also be judged.

In some embodiments, the adaptive range-shift scheme will set a threshold [a, b] for the "high/low level density" of the bitstream bs, and the size of this threshold is usually related to the size of reference capacitor of the LSB and DSM for the first-stage quantization such that the redundancy between the two stages is as small as possible. However, it can also ensure that there is strong robustness against parasitic and interference due to the existence of ARS scheme in the case of small redundancy.

In some embodiments, the adaptive range-shift scheme has an internal logic which ensures that an optimal compensation code for the quantization output of the previous stage can be found within N clock cycles. The threshold will be automatically expanded to [c, d], and so on, until the optimal compensation code can be found within a suitable threshold interval when an optimal compensation code cannot be found within a predetermined threshold [a, b] within a certain period.

In some embodiments, the adaptive range-shift scheme usually only needs to work once when the chip is initialized. After that, the ARS module is in a state of standby waiting to wake up at any time. ARS can also work every time the CDC quantizes the input, not necessarily limited to work at initialization time.

Figure 9:
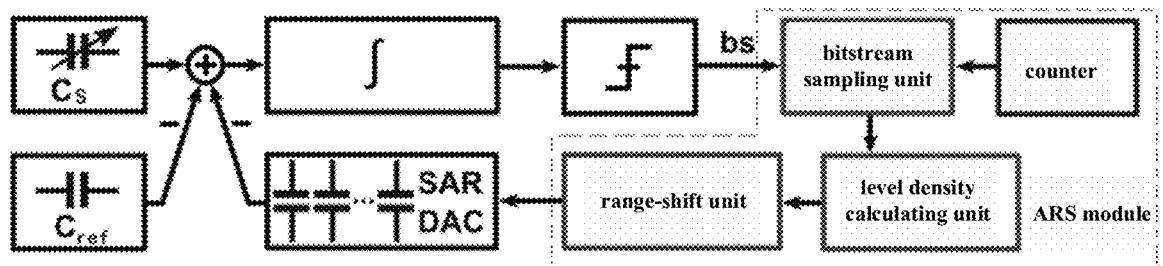
FIG. 9 shows a schematic diagram of the process of an adaptive range-shift technique.

As shown in FIG. 9, FIG. 9 is a schematic diagram of a specific flow of the adaptive range-shift scheme in the present embodiment. The ARS module includes a counter, a bitstream sampling module, a level density calculating module and a range-shift module connected in series. The bitstream bs output from the comparator 5 in the DSM is sampled by the bitstream sampling module, and a number of samples is determined by the counter. The high level/low level density of the bitstream bs is calculated by the level density calculating unit to obtain the level density value. The density value calculated by the level density calculating unit is compared with the preset density value in advance by the range-shift unit. If the density value falls within the preset interval for many times, the optimal compensation code is found. If the optimal compensation code cannot be found within a preset period, the preset density interval will be automatically expanded, and a digital algorithm will continue to search for the compensation code, and so on, until the optimal compensation code is found.

Figure 10:
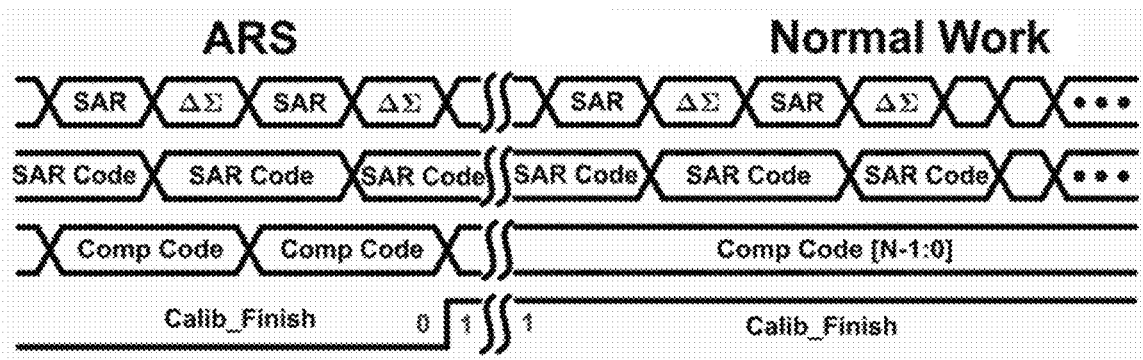
FIG. 10 shows a timing diagram of the adaptive range-shift technique.

As shown in FIG. 10, FIG. 10 is a schematic time sequence diagram of the adaptive range-shift scheme in this embodiment. Usually, ARS works once when the entire capacitance-to-digital converter is initialized. First, SAR is performed to find the coarse quantization digital code, and then DSM fine quantization is performed once. At the same time, output bitstream bs of the DSM is collected by the ARS and the density of the bitstream bs is counted. The digital code to be compensated for the next SAR is determined by comparing the counted density of the bitstream bs with a preset density interval of the bitstream bs. After the next coarse quantization of the SAR is completed, the circuit will automatically add the compensation code to the output quantized digital code of the SAR, thereby realizing compensation, and so on. The loop is repeated for many times until the best compensation code is found, the ARS completion indication signal "Calib Finish" signal will output high level (low level is also possible, as long as it can play an indicating role, that is, high and low levels are only artificially defined) to indicate that the search for the compensation code has ended, and the normal working mode can be entered, that is, one SAR, one DSM, and so on.

Figure 11:
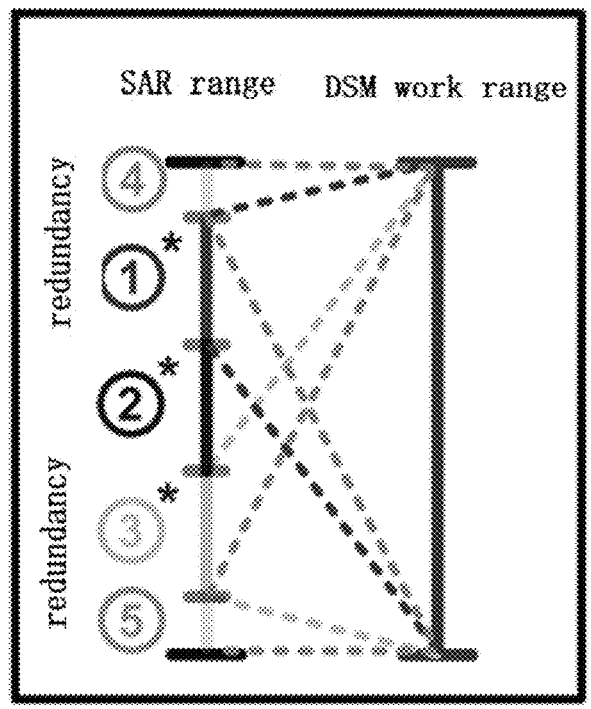
FIG. 11 shows a schematic diagram of a SAR range and a DSM working range of the adaptive range-shift technique.
Figure 12:
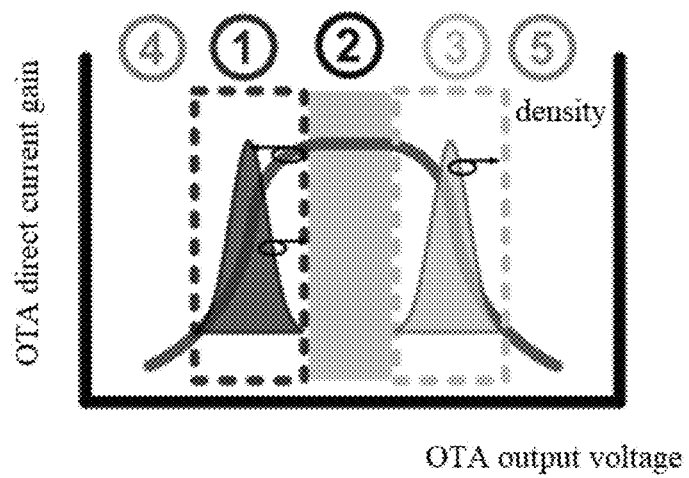
FIG. 12 shows a schematic diagram of the relationship between a OTA output voltage and a OTA DC gain of the adaptive range-shift technique.

As shown in FIG. 11 and FIG. 12 showing the principle of the adaptive range-shift scheme in the present embodiment. Output quantization results of the first-stage SAR corresponds to five ranges ①, ②, ③, ④, and ⑤ of SAR, where range © corresponds to the optimal input range of the DSM. If the quantization output of the SAR falls at this position, the gain and energy efficiency of the amplifier are the highest for the subsequent DSM, so that the final quantization result of the SAR can fall within this range, which is the best result. * in FIG. 11 represents the working range of the DSM. Ranges ①, ②, and ③ are all ranges where DSM can work, but when DSM works in ranges ① and ③, the amplifier gain and energy efficiency will be very low. Therefore, it will seriously affect the system performance of the capacitance-to-digital converter although DSM can work in this range. If the output of the SAR falls into ranges ④ and ⑤, it will directly exceed the input working range of the DSM, which will cause the DSM to fail to work. To sum up, an adaptive range-shift scheme is needed to compensate and correct the situation in which the output of the SAR falls into ranges ①, ③, ④, and ① and the final equivalent quantized output result of SAR can fall into range ②, thereby ensuring that the subsequent-stage DSM works at best condition. The reason why the output quantization results of SAR may fall into ranges ①, ③, ④ and ⑤ is because there are various parasitics, interference, offset (compensation), etc. The adaptive range-shift scheme can compensate these adverse effects by digital algorithms to ensure performance and robustness of the system. An operational transconductance amplifier (OTA) is an amplifier that converts an input differential voltage to an output current.

The core principle for implementation of high-efficiency and robust capacitive sensing in the present embodiment is: it can be determined whether the quantization output result of the SAR falls within the input dynamic range of the DSM or whether it falls within the optimal input range [a, b] of the DSM by counting the high-level/low-level density of bitstream (abbreviated bs) output from the DSM. Quantization output code of the first-stage SAR will be compensated when the coarse quantization output result of the SAR does not fall within the set working range [a, b], 1 is added or distracted for each compensation and DSM is further quantized again. The ARS module will continue to be compensated when the coarse quantization output result of the SAR does not still fall within the set working range [a, b] until the DSM works in the predetermined working range [a, b]. By the scheme, the ARS module can always compensate the first-level output code regardless of errors caused by parasitics or interference to ensure that the second-stage DSM can work normally, thereby improving the robustness of the entire system. In addition, the first stage can also adopt a simpler and more energy-efficient architecture and circuit scheme due to strong robustness of the entire circuit, which helps to improve the energy efficiency of the system. The adaptive range-shift scheme is applied to capacitance-to-digital converters, which can significantly improve robustness and energy efficiency of chips, and play greater roles in future Internet of Things, artificial intelligence, integrated storage and computing chips, communication chips, and biological sensor chips, sensor chips and other fields.

The adaptive range-shift scheme adopted in the embodiments of the present application can be used in the fields of analog-to-digital converters, capacitance-to-digital converters, etc., and can significantly improve the robustness and energy efficiency of chips, and is extremely suitable for application scenarios that require high immunity from interference and ultra-low power consumption. It can accelerate the promotion of future Internet of Things, artificial intelligence, integrated storage and computing chips, communication chips, and biological sensor chips, sensor chips and other fields.

It should be noted that the above embodiments are only configured to explain the technical solutions of the present application, and are not limited thereto. Although the present application is described in detail with reference to the foregoing embodiments, it should be understood by those skilled in the art that the technical solutions described in the foregoing embodiments may be modified and equivalent replacements are made to a part of the technical features and these modifications and substitutions do not depart from scopes of the technical solutions of the embodiments of the present application.

What is claimed is:

1. A capacitance-to-digital conversion circuit, comprising a first module, a comparator and an adaptive range-shift module, in which
   the first module comprises a successive approximation unit, a first adder, a first digital-to-analog converter, a second adder, a third adder, and a first integrating unit connected in series, and the first module further includes a second digital-to-analog converter connected to the third adder,
   the comparator, the adaptive range-shift module and the first adder are connected in series; and
   the comparator is connected to the second digital-to-analog converter.

2. The circuit of claim 1, wherein the adaptive range-shift module comprises a bitstream sampling unit, a level density calculating unit and a range-shift unit connected in series.

3. The circuit of claim 2, wherein the adaptive range-shift module further comprises a counter, and the counter is connected to the bitstream sampling unit.

4. The circuit of claim 1, wherein the second digital-to-analog converter is a reference capacitor.

5. The circuit of claim 1, wherein the capacitance-to-digital conversion circuit further comprises a second module having a same structure as the first module, a second integrating unit of the second module, the comparator and a second digital-to-analog converter of the second module are connected in series, and the adaptive range-shift module is connected to a first adder of the second module.

6. An electronic chip, comprising the capacitance-to-digital conversion circuit claim 1.

7. A capacitance-to-digital conversion method, comprising:
- coarsely quantizing, by a successive approximation unit, a capacitor sensing signal to be measured through a successive approximation register to obtain a coarse quantization result,
- calculating, by a first adder, a sum of the coarse quantization result and a compensation value, the compensation value is derived from an adaptive range-shift module,
- converting, by a first digital-to-analog converter, the sum to a first analog signal,
- calculating, by a second adder, a first difference between the capacitor sensing signal to be measured and the first analog signal,
- calculating, by a third adder, a second difference between the first difference and a second analog signal from a second digital-to-analog converter,
- integrating, by a first integrating unit, the second difference from the third adder to obtain a first integral value,
- performing, by a comparator, differential operation on the first integral value and a reference value to obtain an operation result, and converting the operation result into a bitstream,
- determining, by an adaptive range-shift module, whether the coarse quantization result needs to be compensated based on the bitstream, calculating a compensation value when the coarse quantization result needs to be compensated, and inputting the compensation value into the first adder, and
- converting, by the second digital-to-analog converter, the bitstream from the comparator into a second analog signal, and inputting the converted analog signal to the third adder.

8. The method of claim 7, wherein the adaptive range-shift module comprises a bitstream sampling unit, a level density calculating unit and a range-shift unit connected in series,
- the determining, by an adaptive range-shift module, whether the coarse quantization result needs to be compensated based on the bitstream, calculating a compensation value when the coarse quantization result needs to be compensated comprising:
- sampling, by the bitstream sampling unit, a bitstream output by the comparator to obtain a sampling result,
- calculating, by the level density calculating unit, high level density or low level density of the sampling result to obtain a level density calculation result, and
- determining, by the range-shift unit, whether the coarse quantization result needs to be compensated based on the level density calculation result, calculating a compensation value when the coarse quantization result needs to be compensated and inputting the compensation value into the first adder.

9. The method of claim 7, wherein the capacitance-to-digital conversion circuit further comprises a second module having a same structure as the first module, a second integrating unit of the second module, the comparator and a second digital-to-analog converter of the second module are connected in series, and the adaptive range-shift module is connected to a first adder of the second module,
- a capacitor sensing signal to be measured coarsely quantized by a successive approximation unit of the first module is positive,
- a capacitor sensing signal to be measured coarsely quantized by a successive approximation unit of the second module is negative, and
- the reference value is a second integral value of the second integrating unit of the second module.

10. The method of claim 9, wherein the performing, by a comparator, differential operation on the first integral value and a reference value to obtain an operation result, and converting the operation result into a bitstream comprises:
- performing, by the comparator, differential operation on the first integral value from the first module and a second integral value from the second module to obtain an operation result, and converting the operation result into a first bitstream; the first bitstream being input to the first module, and
- performing inversion operation on the first bitstream to obtain a second bitstream; the second bitstream being input to the second module.

* * * * *